United States Patent
Mano et al.

(10) Patent No.: US 7,578,909 B2
(45) Date of Patent: Aug. 25, 2009

(54) METHOD OF FORMING CNT CONTAINING WIRING MATERIAL AND SPUTTERING TARGET MATERIAL USED FOR THE METHOD

(75) Inventors: Satoru Mano, Hitachi (JP); Harunori Sakaguchi, Hitachi (JP)

(73) Assignee: Hitachi Cable, Ltd., Tokyo (JP)

(*) Notice: Subject to any disclaimer, the term of this patent is extended or adjusted under 35 U.S.C. 154(b) by 686 days.

(21) Appl. No.: 11/076,024

(22) Filed: Mar. 10, 2005

(65) Prior Publication Data

US 2006/0057742 A1    Mar. 16, 2006

(30) Foreign Application Priority Data

Sep. 8, 2004    (JP) .............................. 2004-260373

(51) Int. Cl.
   *C23C 14/34* (2006.01)
(52) U.S. Cl. .............................. 204/192.15; 204/298.12; 204/298.13; 204/298.26; 216/13
(58) Field of Classification Search .................. None
   See application file for complete search history.

(56) References Cited

U.S. PATENT DOCUMENTS

| | | | |
|---|---|---|---|
| 3,709,809 A | * | 1/1973 | Wright .................... 204/192.3 |
| 6,455,847 B1 | * | 9/2002 | Yedur et al. .................. 250/306 |
| 2002/0179564 A1 | * | 12/2002 | Geobegan et al. ............... 216/7 |
| 2003/0056928 A1 | | 3/2003 | Kubota et al. |
| 2003/0175462 A1 | * | 9/2003 | Nishino et al. ........... 428/36.91 |
| 2003/0180461 A1 | * | 9/2003 | Hwang et al. ............ 427/249.1 |
| 2006/0091557 A1 | | 5/2006 | Sakamoto et al. |

FOREIGN PATENT DOCUMENTS

| | | |
|---|---|---|
| JP | 61-110762 | 5/1986 |
| JP | 02-148733 | 6/1990 |
| JP | 02-263982 | 10/1990 |
| JP | 2004-156074 | 6/2004 |
| WO | WO 01/68936 | 9/2001 |
| WO | WO 2004/040044 A1 | 5/2004 |
| WO | WO 2004/051726 | 6/2004 |

OTHER PUBLICATIONS

Japanese Office Action dated Dec. 16, 2008 with English Translation.

* cited by examiner

*Primary Examiner*—Nam X Nguyen
*Assistant Examiner*—Jason M Berman
(74) *Attorney, Agent, or Firm*—McGinn IP Law Group, PLLC

(57) ABSTRACT

A method of forming a CNT containing wiring material is conducted by sputtering simultaneously CNT and a metal material on a surface of a substrate to form a CNT containing metal layer, then pattern-etching the CNT containing metal layer to form a wiring pattern. A sputtering target material having a metal material and CNT is used in the method.

15 Claims, 3 Drawing Sheets

STEP A

STEP B

STEP C

STEP D

STEP E

METHOD OF FORMING CNT CONTAINING WIRING MATERIAL AND SPUTTERING TARGET MATERIAL USED FOR THE METHOD

The present application is based on Japanese patent application No. 2004-260373, the entire contents of which are incorporated herein by reference.

BACKGROUND OF THE INVENTION

1. Field of the Invention

This invention relates to a method of forming a wiring material with a wiring pattern on the surface of an insulating substrate and, particularly, to a method of forming a wiring material with a wiring pattern, which contains CNT (carbon nanotube) mixed in a metal material, on the surface of an insulating substrate.

2. Description of the Related Art

A carbon nanotube (herein referred to as CNT) is a material that has an excellent electric conductivity, thermal conductivity, and mechanical properties. Therefore, it is used for various applications. One of the applications is a wiring material that a wiring pattern made of a metal material is formed on the surface of an insulating substrate.

It is tried that CNT is mixed into a metal material for the wiring material so as to enhance a resistance to electromigration and an electric conductivity to decrease the line width of a wiring pattern. For that purpose, the CNT has to be uniformly dispersed in the metal material to compose the wiring pattern. The electromigration means a phenomenon that an electron to flow through a wiring collides with a wiring metal atom, thereby the metal atom moves, causing a disconnection of the wiring.

Japanese patent application laid-open No. 2004-156074 discloses a method of uniformly mixing CNT into a metal material, where a dispersion agent and CNT is added into a metal plating solution, thereby the CNT is dispersed by the dispersion agent the metal plating solution, and the metal plating is conducted such that a metal plating film with CNT mixed uniformly therein is formed on the surface of a substrate. The dispersion agent used is cationic and/or anionic surfactant(s).

However, in the above method, since the metal plating film obtained is the dispersion agent exists at the interface of CNT and the metal material, the interface resistance between the CNT and the metal material must increase and, therefore, the electric conductivity cannot be enhanced as expected.

SUMMARY OF THE INVENTION

It is an object of the invention to provide a method of forming a CNT containing wiring material that allows a substantial enhancement in the electric conductivity of the wiring pattern as well as the uniform dispersion of CNT in the metal material for the wiring material.

It is a further object of the invention to provide a sputtering target material suitably used in the above method.

According to one aspect of the invention, a method of forming a CNT containing wiring material comprises the steps of:

sputtering simultaneously CNT and a metal material on a surface of a substrate to form a CNT containing metal layer; and pattern-etching the CNT containing metal layer to form a wiring pattern.

It is preferred that the sputtering step is conducted using a target material that comprises the CNT and the metal material.

It is also preferred that the sputtering step is conducted using a target material that comprises the CNT and a target material that comprises the metal material.

It is preferred that the metal material comprises at least one of Al, Cu, Au, Ag, Pt, Pd, Ni, Fe, Cr and Ti.

According to another aspect of the invention, a sputtering target material comprises:

a metal material; and

CNT.

It is preferred that the metal material comprises at least one of Al, Cu, Au, Ag, Pt, Pd, Ni, Fe, Cr and Ti.

ADVANTAGES OF THE INVENTION

In the invention, without using the dispersion agent (surfactant) as done conventionally, the method of forming the CNT containing wiring material can be conducted to mix the CNT in the metal material. Therefore, the interface resistance between the CNT and the metal material can be reduced and the electric conductivity can be enhanced.

Further, since the metal material for the wiring material can have the CNT dispersed uniformly, the electric conductivity of the wiring pattern can be enhanced. Also, due to the CNT mixed therein, the resistance to electromigration and the thermal conductivity can be necessarily enhanced. Thereby, reduction in the line width of the wiring pattern can be practically realized.

The sputtering target material of the invention can be applied to the existing sputtering apparatus. Namely, without requiring a new apparatus, the sputtering target material of the invention can be used to form the CNT containing metal film (wiring material) that has an excellent electric conductivity and uniform CNT dispersion property. Therefore, the CNT containing metal film (wiring material) with the excellent properties can be manufactured without increasing the cost.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Methods of forming a CNT containing wiring material in the preferred embodiments of the invention will be explained below.

The methods of forming a CNT containing wiring material of the invention is characterized in that CNT and a metal material are simultaneously sputtered on the surface of a substrate to form a CNT containing metal layer, and the metal layer is pattern-etched to form a wiring pattern. Since the CNT and the metal material are simultaneously sputtered to form the CNT containing metal layer, CNT can be uniformly mixed in the metal material even without using any dispersion agent (surfactant). Thereby, the interface resistance between CNT and the metal material can be reduced and therefore the electric conductivity of wiring can be increased.

It is preferred that a target material containing a metal material and CNT is used as the sputtering target material. Alternatively, the sputtering may be conducted using two separate target materials, the metal material and CNT.

It is preferred that the metal material is a material containing at least one of Al, Cu, Au, Ag, Pt, Pd, Ni, Fe, Cr and Ti. Herein, the metal material means a metal material except CNT in terms of the concepts of the invention.

Herein, the sputtering means a method that a target material as a negative pole is opposed to a substrate on which a film is formed, an inert gas is flown into a chamber containing a target material negatively charged, plasmas are generated due to the collision of plasma electron and the inert gas, positive ion in the plasmas collides with the surface of the target material to push out atoms or molecules composing the target, and the atoms or molecules pushed out are attached onto the opposed surface of the substrate to form the film.

The CNT has such a property that its electron state varies depending on its structure and its characteristics vary from metal to semiconductors with various bandgaps. It is preferred the CNT used in the invention has metal characteristics rather than semiconductor characteristics. Also, it is preferred that CNT with metal characteristics is predominant in quantity in the total CNT.

First Embodiment

Figure 1:
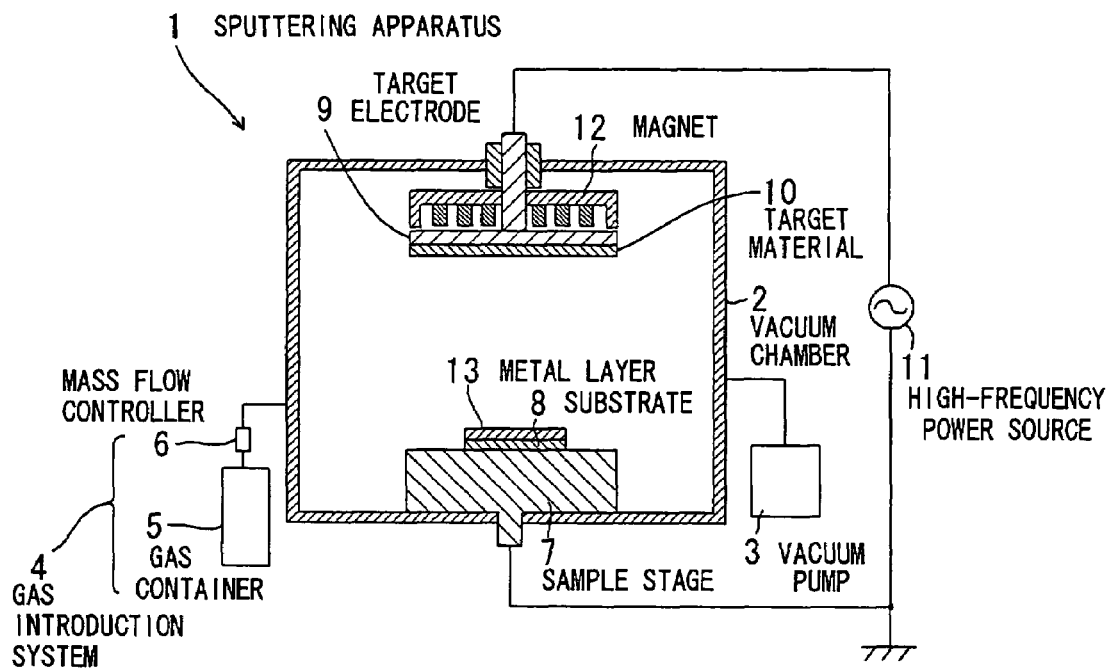
FIG. 1 is a schematic diagram showing a sputtering apparatus used for a method of forming a CNT containing wiring material in a first preferred embodiment according to the invention, where a CNT containing target material is used in forming a CNT containing metal layer on the surface of a substrate.

FIG. 1 is a schematic diagram showing a sputtering apparatus used for a method of forming a CNT containing wiring material in the preferred embodiment according to the invention, where a CNT containing target material is used in forming a CNT containing metal layer on the surface of a substrate.

The sputtering apparatus 1 is provided with a vacuum chamber 2. The vacuum chamber 2 is connected with an exhaust system composed of a vacuum pump 3 which is disposed outside of the vacuum chamber 2. The internal pressure of the vacuum chamber 2 is reduced to vacuum by operating the vacuum pump 3.

A gas introduction system 4 is disposed outside of the vacuum chamber 2. The gas introduction system 4 includes a gas container 5, which is connected through a piping system to the vacuum chamber 2. In the gas container 5, an inert gas such as argon is contained as a sputtering gas. On the way of the piping system from the gas container 5 to the vacuum chamber 2, a mass flow controller 6 is provided. The argon gas is controlled in flow rate by the mass flow controller 6 and then introduced into the vacuum chamber 2.

A sample stage 7 is disposed downward in the vacuum chamber 2. The sample stage 7 has a flat surface to mount a substrate 8 thereon.

A target electrode 9 is disposed upward in the vacuum chamber 2 while being insulated from the vacuum chamber 2 and opposed to the sample stage 7. The target electrode 9 is provided with a target material 10 on its surface opposed to the sample stage 7. The target material 10 is made of CNT mixed in a copper material. Magnets 12 are disposed on the opposite side to the side of the target electrode 9 on which the target material 10 is opposed to the sample stage 7. The magnets 12 functions to apply a magnetic field to the surface of the target material 10 to generate high-density plasma near the target material 10 to enhance the speed of film formation.

A high-frequency power source 11 is disposed outside the vacuum chamber 2. The high-frequency power source 11 is connected with the target electrode 9 and the sample stage 7. The vacuum chamber 2 is grounded and is insulated from the target electrode 9 as described earlier. A negative voltage is applied to the target electrode 9 by operating the high-frequency power source 11.

A method of forming a CNT containing metal layer 13 on the substrate 8 by using the sputtering apparatus 1 composed as described above will be explained below.

First, the vacuum pump 3 is operated to vacuum the inside of the vacuum chamber 2. In this embodiment, the internal pressure of the vacuum chamber 2 is set to be $1 \times 10^{-4}$ Pa.

Then, the substrate 8 is introduced in the vacuum chamber 2 while the internal pressure of the vacuum chamber 2, and is mounted on the sample stage 7. Then, the gas introduction system 4 is operated to introduce the sputtering gas into the vacuum chamber 2. In this embodiment, argon gas is used as the sputtering gas and the internal pressure of the vacuum chamber 2 is set to be 2 Pa.

Then, the high-frequency power source 11 is operated to apply the negative voltage to the target electrode 9. At that time, electric discharge occurs in the vacuum chamber 2 and plasma positive ion Ar+ is thereby generated. The positive ion collides with the target material 10 while being accelerated by the negative voltage, and the atoms or molecules of the target material 10 are thereby pushed out and then attached onto the surface of the substrate 8 mounted on the sample stage 7. Thus, the metal layer 13 is formed thin on the substrate 8. Since the target material 10 is composed of CNT mixed in the Cu metal material, the CNT and Cu are simultaneously sputtered thereon. Therefore, the metal layer 13 is formed on the substrate 8 such that the CNT is uniformly dispersed in the thin Cu layer.

Second Embodiment

Figure 2:
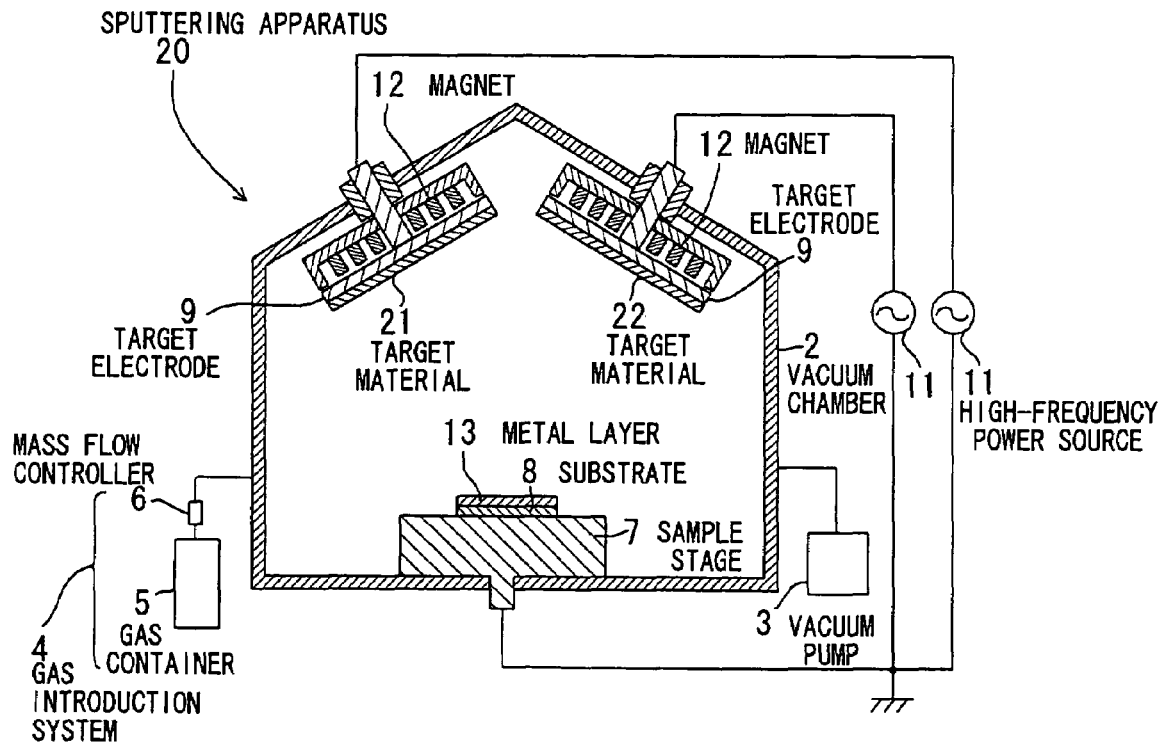
FIG. 2 is a schematic diagram showing a sputtering apparatus used for a method of forming a CNT containing wiring material in a second preferred embodiment according to the invention, where two target materials containing CNT and a metal material, respectively are used in forming the CNT containing metal layer on the surface of a substrate.

FIG. 2 is a schematic diagram showing a sputtering apparatus 20 used for a method of forming a CNT containing wiring material in the second preferred embodiment according to the invention. In FIG. 2, like parts are indicated by the same numerals as used in the first embodiment and the explanations thereof are omitted below.

The sputtering apparatus 20 of the second embodiment is different from that of the first embodiment in that two target materials 21, 22 containing CNT and a metal material, respectively are separately disposed.

The two target electrodes 9 are disposed upward in the vacuum chamber 2 of the sputtering apparatus 20. The target materials 21, 22 are each disposed on the surface of the target electrode 9 opposed to the sample stage 7. The target electrodes 9 are each connected with the separate high-frequency power sources 11 that can be independently controlled.

The target material 21 is made of a CNT material, and the target material 22 is made of a Cu metal material.

When the sputtering apparatus 20 is used to form the CNT containing metal layer 13 on the substrate 8, as described in the first embodiment, the vacuum pump 3 is operated to vacuum the inside of the vacuum chamber 2, the substrate 8 is mounted on the sample stage 7, and the sputtering gas is introduced into the vacuum chamber 2.

In that state, the two high-frequency power sources 11 are operated to apply the negative voltage to the two target electrodes 9, respectively. Thereby, the CNT material and the Cu metal material are sputtered from the two target materials 21, 22, attached onto the surface of the substrate 8 mounted on the sample stage 7. Thus, the CNT containing metal layer 13 is formed on the substrate 8. Similar to the first embodiment, the metal layer 13 is formed on the substrate 8 such that the CNT is uniformly dispersed in the thin Cu layer.

Although in the first and second embodiments, the sputtering employs a magnetron system, it may employ anther system. For example, it can use a basic system, a bipolar system, or a tripolar system where a hot cathode to discharge thermal electron is added to the bipolar system, or an ion beam system where high-energy ion beam is irradiated to a target, or an opposed target system where two targets are in parallel opposed and a magnetic field is applied perpendicularly to the surface of the targets, or an ECR system using electron cyclotron resonance (ECR), or a co-axial type sputtering system where a target material and a substrate are disposed as coaxial cylinders, or a reactive sputtering system where a reactive gas is supplied in the vicinity of a substrate to control the film composition.

Although the metal material used for the target material 10, 22 is copper (Cu), any of Al, Au, Ag, Pt, Pd, Ni, Fe, Cr and Ti may be used as the metal material to form the CNT containing metal layer. Also, an alloy that contains at least one of these metal elements can be used as the metal material. The substrate 8 can made of an insulating material such as plastics, glass and ceramics.

Third Embodiment

Another embodiment for the method of forming the CNT containing wiring material of the invention includes a method of forming a wiring pattern by pattern-etching the CNT containing metal layer 13, which will be explained below.

FIGS. 3A to 3E are schematic cross sectional views showing the method of forming the wiring pattern by photolithography after forming the CNT containing metal layer 13 on the substrate 8 as described in the first or second embodiment.

Figure 3A:
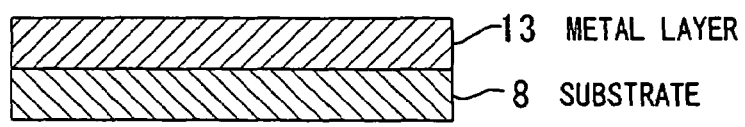
FIGS. 3A to 3E are schematic cross sectional views showing the method of forming the CNT containing wiring material in the embodiments, where the CNT containing metal layer is pattern-etched to form a wiring pattern.
Figure 3B:
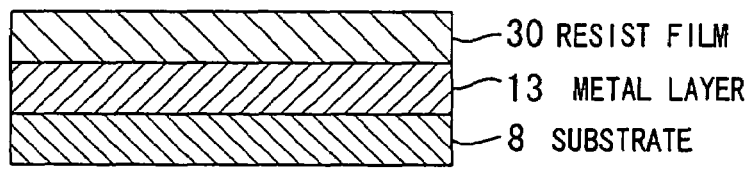
Figure 3C:
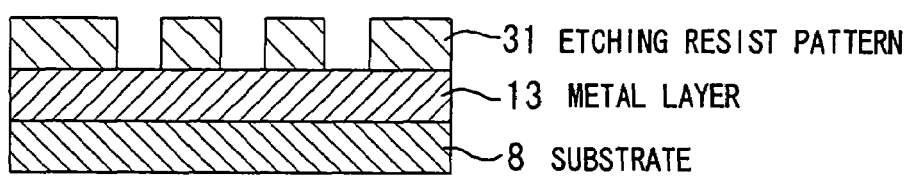
Figure 3D:
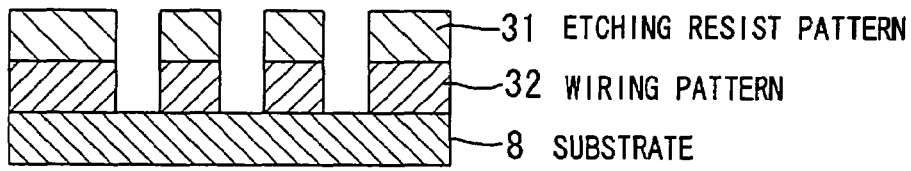
Figure 3E:
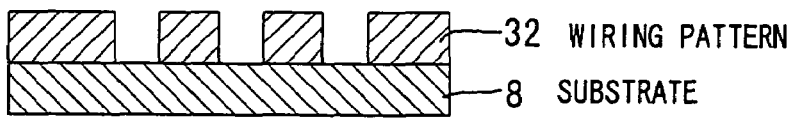

Steps A to E as shown in FIGS. 3A, 3B are conducted in the method of forming the wiring pattern.

(Step A): The CNT containing metal layer 13 is formed on the substrate 8 as described in the first or second embodiment.

(Step B): Photoresist is coated on the CNT containing metal layer 13 to form a resist film 30 of about 1 μm in thickness.

(Step C): The resist film 30 is exposed according to a predetermined circuit pattern, and the exposed part is removed by reacting with a developing solution, thereby forming an etching resist pattern 31. In this embodiment, a circuit pattern mask (not shown) used as the predetermined circuit pattern is of a positive film that light is transmitted at a portion of the predetermined circuit pattern and light is not transmitted at the other portion, or a negative film that light is not transmitted at a portion of the predetermined circuit pattern and light is transmitted at the other portion. The exposure is conducted such that the circuit pattern mask is disposed closely attached onto the resist film 30 or disposed with a predetermined gap on the resist film 30, an exposure medium such as ultraviolet light is irradiated thereon, thereby the resist film 30 is exposed according to the predetermined circuit pattern.

(Step D): Using the etching resist pattern 31 as a mask, the CNT containing metal layer 13 is etched by RIE (reactive ion etching) to form a wiring pattern 32.

(Step E): The unnecessary etching resist pattern 31 on the wiring pattern 32 is removed.

As described above, the CNT containing wiring material of the invention is formed with the wiring pattern 32 on the substrate 8.

Fourth Embodiment

Another embodiment for the method of forming the CNT containing wiring material of the invention includes a method of preparing a sputtering target material that includes the metal material and CNT.

Figure 4:
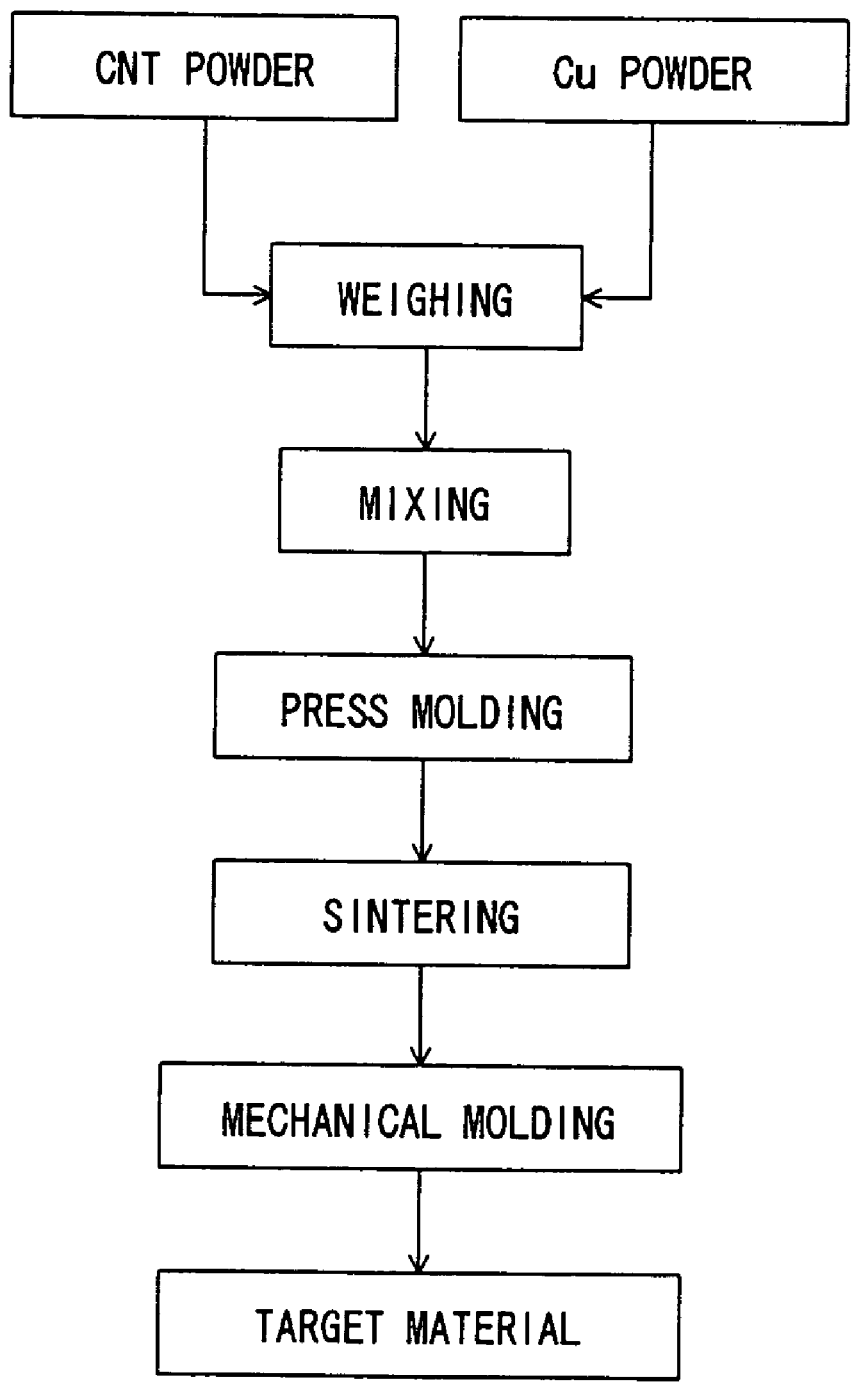
FIG. 4 is a flow chart showing a preparing a sputtering target material in a preferred embodiment according to the invention, where the sputtering target material includes the metal material and CNT.

FIG. 4 is a flow chart showing the method of preparing the sputtering target material in a preferred embodiment according to the invention, where the sputtering target material is prepared by sintering.

Raw materials for the target material, a CNT power and a Cu powder are provided and weighed. In this embodiment, the ratio of CNT and Cu is 30 wt % and 70 wt %, respectively. It is preferred that the ratio of CNT mixed into the metal material is 10 wt % to 80 wt %.

Then, the raw materials are mixed.

Then, the mixed powers are filled in a mold, and press-molded by cold isostatic press.

Then, the molded material is encapsulated in a metal can, and sintered by hot isostatic press. Meanwhile, when using a hot press (HP), the press-molding and the sintering can be performed in one process.

Then, the sintered object is processed into a predetermined shape by mechanical molding. Thus, the target material can be obtained.

Although in this embodiment copper (Cu) is used as the target metal material, any powder of Al, Au, Ag, Pt, Pd, Ni, Fe, Cr and Ti can be used to preparing the CNT containing target material.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of forming a carbon nanotube (CNT)-containing wiring material, comprising:
    sputtering simultaneously CNT and a metal material on a surface of a substrate to form a CNT-containing metal layer; and
    pattern-etching the CNT-containing metal layer to form a wiring pattern,
    wherein the sputtering is conducted using a target material comprising the CNT and the metal material.

2. A method of forming a carbon nanotube (CNT)-containing wiring material, comprising:
    sputtering simultaneously CNT and a metal material on a surface of a substrate to form a CNT-containing metal layer; and pattern-etching the CNT-containing metal layer to form a wiring pattern, wherein the sputtering is conducted using a first target material comprising the CNT and a second target material comprising the metal material.

3. The method according to claim 1, wherein the metal material comprises at least one of Al, Cu, Au, Ag, Pt, Pd, Ni, Fe, Cr, and Ti.

4. The method according to claim 2, wherein the metal material comprises at least one of Al, Cu, Au, Ag, Pt, Pd, Ni, Fe, Cr, and Ti.

5. The method according to claim 1, wherein the CNT is uniformly dispersed in the target material.

6. The method according to claim 2, wherein the CNT is uniformly dispersed in the target material.

7. The method according to claim 1, wherein the CNT has characteristics that resemble a metal.

8. The method according to claim 1, wherein said sputtering employs one of a magnetron system, a bipolar system, an ion beam system, an opposed target system, an electron cyclotron resonance system, a co-axial type sputtering system, and a reactive sputtering system to perform said sputtering.

9. The method according to claim 3, wherein the metal material comprises an alloy comprising at least one of Al, Cu, Au, Ag, Pt, Pd, Ni, Fe, Cr, and Ti.

10. A sputtering apparatus, comprising:
a sputtering target material, comprising:
a molded material, comprising:
a metal material; and
a carbon nanotube (CNT) mixed into the metal material.

11. The sputtering apparatus according to claim 10, wherein the metal material comprises at least one of Al, Cu, Au, Ag, Pt, Pd, Ni, Fe, Cr, and Ti.

12. The sputtering apparatus according to claim 10, further comprising:
a sputtering surface to be sputtered; and
an attaching surface to be attached to a target electrode,
wherein said CNT is formed at least at said sputtering surface.

13. The sputtering apparatus according to claim 12, wherein the CNT is dispersed uniformly in the metal material.

14. The sputtering apparatus according to claim 10, wherein a ratio of the CNT mixed into the metal material is in a range from 10 wt % to 80 wt %.

15. The sputtering apparatus according to claim 10, wherein said sputtering target material includes material functioning as a negative pole to be opposed to a substrate on which a film is formed.

* * * * *